(12) United States Patent
Kärkkäinen et al.

(10) Patent No.: US 9,273,209 B2
(45) Date of Patent: Mar. 1, 2016

(54) SILOXANE POLYMER COMPOSITIONS

(75) Inventors: Ari Kärkkäinen, Oulu (FI); Milja Hannu-Kuure, Oulu (FI); Sacha Legrand, Oulu (FI); Admir Hadzic, Oulu (FI); Graeme Gordon, Oulu (FI)

(73) Assignee: Braggone Oy, Oulu (FI)

( * ) Notice: Subject to any disclaimer, the term of this patent is extended or adjusted under 35 U.S.C. 154(b) by 913 days.

(21) Appl. No.: 12/745,355

(22) PCT Filed: Nov. 28, 2008

(86) PCT No.: PCT/FI2008/050700
§ 371 (c)(1),
(2), (4) Date: Jan. 24, 2011

(87) PCT Pub. No.: WO2009/068755
PCT Pub. Date: Jun. 4, 2009

(65) Prior Publication Data
US 2011/0111340 A1    May 12, 2011

Related U.S. Application Data

(60) Provisional application No. 60/991,435, filed on Nov. 30, 2007.

(51) Int. Cl.
| | | |
|---|---|---|
| C08L 83/06 | (2006.01) | |
| C08L 83/08 | (2006.01) | |
| G03F 7/075 | (2006.01) | |
| G03F 7/004 | (2006.01) | |
| C08G 77/06 | (2006.01) | |
| C08G 77/16 | (2006.01) | |
| C08G 77/26 | (2006.01) | |
| C08G 77/28 | (2006.01) | |
| C08G 77/32 | (2006.01) | |
| G03F 7/30 | (2006.01) | |
| G03F 7/32 | (2006.01) | |
| C08K 5/00 | (2006.01) | |
| G03F 7/00 | (2006.01) | |
| C08G 77/14 | (2006.01) | |
| C08G 77/20 | (2006.01) | |
| C08G 77/00 | (2006.01) | |

(52) U.S. Cl.
CPC ................ *C08L 83/06* (2013.01); *C08G 77/06* (2013.01); *C08G 77/14* (2013.01); *C08G 77/16* (2013.01); *C08G 77/20* (2013.01); *C08G 77/26* (2013.01); *C08G 77/28* (2013.01); *C08G 77/32* (2013.01); *C08G 77/80* (2013.01); *C08K 5/0025* (2013.01); *C08L 83/08* (2013.01); *G03F 7/004* (2013.01); *G03F 7/0007* (2013.01); *G03F 7/0757* (2013.01); *G03F 7/30* (2013.01); *G03F 7/322* (2013.01)

(58) Field of Classification Search
None
See application file for complete search history.

(56) References Cited

U.S. PATENT DOCUMENTS

| | | | | |
|---|---|---|---|---|
| 5,457,003 | A * | 10/1995 | Tanaka et al. ................. | 430/176 |
| 6,114,085 | A * | 9/2000 | Padmanaban et al. ..... | 430/270.1 |
| 7,094,709 | B2 | 8/2006 | Karkkainen | |
| 2005/0161645 | A1 | 7/2005 | Cheben et al. | |
| 2005/0245634 | A1 | 11/2005 | Soutar et al. | |
| 2006/0166132 | A1 * | 7/2006 | Meagley .................... | 430/270.1 |

FOREIGN PATENT DOCUMENTS

| | | |
|---|---|---|
| EP | 1813985 A1 | 8/2007 |
| JP | 2004102247 A | 4/2004 |
| JP | 2005-004052 A | 1/2005 |
| JP | 2005-321667 A | 11/2005 |
| JP | 2005004052 | 1/2006 |

OTHER PUBLICATIONS

DERWENT English abstract for JP2005-4052 (2005).*
Machine-assisted English translation for JP2005-4052 (2005) provided by JPO.*
Partial English translation (including [0010]) of JP2005-4052 provided by PTO (2005).*
PCT Search Report for Serial No. PCT/FI2008/0050700 dated Apr. 7, 2009.

* cited by examiner

*Primary Examiner* — Sin Lee
(74) *Attorney, Agent, or Firm* — McCormick, Paulding & Huber LLP

(57) ABSTRACT

A siloxane composition and a method of producing the same. The composition comprises a siloxane prepolymer with a backbone exhibiting a group which is capable of being deprotonated in an aqueous base solution. Further, there are reactive functional groups, which are capable of reacting during thermal or radiation initiated curing. The siloxane is cross-linked during condensation polymerization to increase molecular weight thereof.

The composition can be used in high-resolution negative tone lithographic fabrication processes where a water based developer system is applied in the development step of the lithography process.

6 Claims, 3 Drawing Sheets

Positive tone photosensitive material process

Negative tone photosensitive material process

SILOXANE POLYMER COMPOSITIONS

CROSS REFERENCE TO RELATED APPLICATIONS

This application is entitled to the benefit of and incorporates by reference essential subject matter disclosed in International Patent Application No. PCT/FI2008/050700 filed on Nov. 28, 2008 and U.S. Patent Application No. 60/991,435 filed Nov. 30, 2007.

BACKGROUND OF THE INVENTION

1. Field of the Invention

The present invention relates to siloxane polymer compositions. In particular, the invention relates to siloxane polymer compositions which have suitable properties for use in negative tone lithographic fabrication processes. The invention also relates to synthesis, polymerization and cross-linking of such compositions.

2. Description of Related Art

Photolithography is a common technique used in fabrication of semiconductor devices, such as integrated circuits (ICs), in flat panel display devices, such as liquid crystal displays, plasma displays, and organic light emitting displays, and in opto-electronic and photonic devices, such as waveguide and light-guide structures, gratings and photonic crystals.

In a photolithographic process, a layer of a photosensitive material is deposited on a substrate to form a coating. The deposited material layer is selectively exposed to some form of radiation, such as ultraviolet-light. An exposure tool and a mask or, in step-and-repeat projection-systems, a reticle are used to produce the desired selective exposure. The mask contains clear and opaque features that define the pattern to be created in the photosensitive material layer. The areas that are exposed to the light are made either soluble or insoluble by the use of a specific solvent known as a developer.

In the case where the irradiated (exposed) regions are soluble, a positive-image of the mask is produced in the photosensitive material. Such a material is called a positive tone photosensitive material [see attached FIG. 1(a)].

If, on the other hand, the non-irradiated regions are dissolved by the developer, a negative-image results. The material in this case is called a negative tone photosensitive material [see FIG. 1(b)].

Following the exposure the photosensitive material film must undergo a development step to turn the latent-image in the photosensitive material to the final image. In processes where the photosensitive material functions as a "sacrificial layer/structure", the areas of the photosensitive material that remain after development serve to mask the substrate regions which they cover in subsequent etching or ion-implantation steps.

Locations from which the photosensitive material has been removed can be subjected to a variety of subtractive or additive processes that transfer the pattern onto the substrate surface. In processes where the photosensitive material functions as an "active layer/structure", the areas of the photosensitive material that remain after development are used as they are in the final device/component structure and no additional etching or other subtractive or additive processes are needed.

Typically the positive tone photosensitive material developers are aqueous alkaline solutions, i.e. alkaline solutions diluted with water. To mention some typical examples: aqueous solutions of tetra methyl ammonium hydroxide (TMAH-water solutions) and potassium hydroxide (KOH-water solutions) are extensively used. These types of aqueous developers are favourable since they are commonly used by the industry and are also environmentally safe.

By contrast, the negative tone photosensitive material developers are typically organic solvent-based or -borne developers [e.g. acetone, isopropyl alcohol (IPA), methyl isobutyl ketone (MIBK), xylene and toluene] and this creates potentially severe environmental, health and safety (EHS) problems. Organic solvent-based developers are commonly used in lithographic processing of organo-siloxane polymer compositions. Typical developers that are used are acetone, IPA and MIBK. Water-soluble developers for negative tone siloxane materials have not been available.

Another problem relates to the fact that for many siloxane compositions resolution performance during photolithography is poor—for a 1.5 micrometer film, it is difficult to obtain a resolution better than 4-5 μm. The shape of the resulting structure from the photolithography step is also easily rounded.

SUMMARY OF THE INVENTION

It is an object of the present invention to remove at least a part of the problems relating to the art and to provide negative tone siloxane polymer compositions for aqueous basic developer systems.

In particular, it is an aim of the present invention to provide new material compositions that have suitable properties to be used in negative tone lithographic fabrication processes where water based developer system is applied in the development step of the lithography process.

It is second aim of the present invention to provide material compositions with improved properties of resolution that are suitable to produce films and structures by using conventional and cost-efficient processing from the liquid phase, including spin-on, dip, spray, ink-jet, roll-to-roll, gravure, flexographic, curtain, screen printing coating methods, extrusion coating and slit coating, but are not limited to these.

The patterning of the thermally and/or irradiation sensitive material compositions can be performed via direct lithographic patterning, conventional lithographic masking and etching procedure, imprinting and embossing, but are not limited to these.

It is a third aim of the invention to provide material compositions that can be cured at relatively low processing temperatures e.g. at a temperature of max 240° C. or even at temperature of 100° C.

It is a fourth aim of the invention to provide material compositions that can be cured at temperatures up to 450° C., or even up to 900° C., making it possible for the compositions to be combined the material film or structures with following high temperature deposition steps, such as some sputtering, firing, thermal evaporation and/or CVD processes.

It is a sixth aim of the invention to provide a material composition that functions as optical layer in a display device (such as LCD, Plasma, OLED display), solar cell, LED or semiconductor device.

It is a seventh aim of the invention to provide material compositions that after film deposition (optionally patterning) and curing the material film or structures are capable of withstanding aggressive wet etching and dry etching process steps of any subsequent deposition/patterning process steps.

It is an eight aim of the invention to provide material compositions that are capable of performing as a planarization layer on a substrate or electronic device which may have protruding structures on top of it. This substrate may be part of a display device (e.g. liquid crystal display or plasma display or OLED display).

It is a ninth aim of the invention to provide material compositions that are capable of performing as an insulating layer on a substrate or in an electronic component. This insulating layer can also function simultaneously as a planarization layer on a substrate or in an electronic device. This substrate and/or electronic device (such as a thin film transistor) can be part of a display device (e.g. liquid crystal display or plasma display or OLED display).

It is a tenth aim of the invention to provide material compositions that can be deposited on various substrate surfaces, such as glass, silicon, silicon nitride, metals and plastics.

It has been found that when the siloxane polymer has a high content of groups that a capable of undergoing deprotonation in an alkaline environment, the siloxane polymer is easily dissolved into an base-water developer solution (e.g. in tetra methyl ammonium hydroxide, in the following also abbreviated "TMAH", or potassium hydroxide, KOH).

Examples of such groups include hydroxyl, amino, thiol, and carboxyl. The groups capable of undergoing deprotonation can be attached directly to the silicon atoms of the siloxane polymer backbone or attached to organic functionalities which are attached to the siloxane polymer backbone. The siloxane polymer further exhibits reactive functional groups, e.g. amine, epoxy, acryloxy, allyl or vinyl groups. These reactive organic groups are capable of reacting during the thermal or radiation initiated curing step.

Further, according to the invention, the siloxane is partially cross-linked during condensation polymerisation to increase the molecular weight thereof.

The deprotonating groups will be present in sufficient amount to make the partially cross-linked polymer soluble in the basic developer solution. There will also be a sufficient amount of active reactive to provide for cross-linking as a result of UV exposure.

The method of producing a siloxane prepolymer composition, comprises
  hydrolysing at least two different silane monomers,
  condensating the silane monomers and partially cross-linking them to form a siloxane polymer having a molecular weight of about 1500 to 20,000 g/mol, and
  incorporating a photo reactive compound and a solvent for the siloxane polymer,
in order to formulate a siloxane prepolymer liquid composition.

The present invention further provides a method of using a siloxane prepolymer composition in a lithography method, comprising
  optionally adjusting the solid contents of a partially cross-linked prepolymer composition material to the required film thickness of the deposited film,
  depositing the composition on a substrate to form a layer having a film thicknesses of 10 nm-10 μm,
  optionally heat treating the deposited film,
  subjecting the deposited material layer to lithography by using a photo mask or reticle and exposing the material to UV light,
  optionally heat treating the exposed material, and
  removing the non-exposed areas of the film are removed in a development step, by contacting the layer with an aqueous basic developer solution.

The invention provides considerable advantages. Thus, the novel siloxanes are soluble in aqueous alkaline developers which are commonly used by industry and they are also environmentally safe. The partially cross-linked siloxane polymer will give excellent resolution during lithography.

BRIEF DESCRIPTION OF THE DRAWINGS

FIG. 3b shows a resolution marker image of a high molecular weight material;

DETAILED DESCRIPTION OF PREFERRED EMBODIMENTS

Figure 1A:
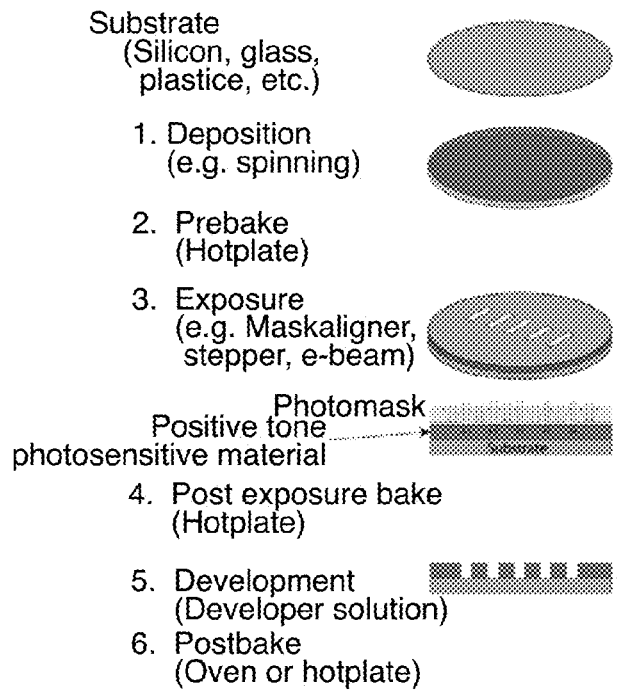
FIG. 1a shows in a schematic fashion the main step of a lithographic process for a positive tone photosensitive material.
Figure 1B:
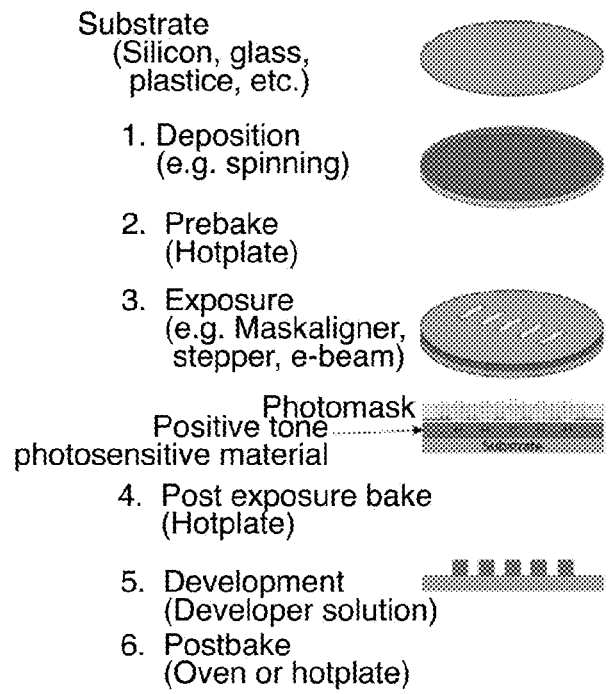
FIG. 1b shows the same steps of the lithographic process for a negative tone photosensitive material process.

As mentioned already above the present invention relates generally to synthesis and polymerization of siloxane polymer compositions that have properties which make them suitable for use in negative tone lithographic fabrication processes and which give them properties of improve resolution.

In particular, the present invention provides synthesis and polymerizations methods of the siloxane or organo-siloxane polymer compositions which are applicable directly in manufacturing lines that use alkaline-aqueous based developer systems. For the purpose of the present invention, the terms "alkaline-aqueous" and "basic-aqueous" and "aqueous base" and similar are interchangeably used to designate aqueous solution that have a pH in excess of 7, preferably in excess of 9 and suitably about 11 to 14, in particular about 11 to 13 or 12 to 13. The basic component can be an alkali metal or earth alkaline metal hydroxide or metal carbonate, an amine or any other suitable alkaline/basic compound and combinations of two or more such substances.

"Partially cross-linked" refers to the fact that a part of the active groups of the siloxane prepolymer are activated already during condensation to obtain cross-linking, however leaving so many active groups that further cross-linking is possible during photolithography. Generally at least 10 mol-% of the groups are reacted during polymerization, in particular about 20 to 90 mol-%, preferably about 25 to 75 mol-%.

It is particularly preferred to incorporate into the siloxane prepolymer active groups of several kinds, one kind of which is active during cross-linking (and which is then fully reacted) and another one which is active during photolithography.

In the present invention the novel material compositions are siloxane polymers, which in the following are also interchangeably called "prepolymers" because they will give rise to polymers having higher molecular weight during the lithographic process. The siloxane polymers/prepolymers are synthesized by using silane precursor molecules as starting materials. The polymers have a siloxane backbone comprising repeating units —Si—O—. Generally, in the formula (—Si—O—)$_n$ the symbol n stands for an integer 2 to 1000, in particular about 3 to 100.

The molecular weight range for the partially cross-linked prepolymer material is in range of 1500 to 20,000, preferably about 2,000 to 15,000, in particular about 4,000 to 12,000 g/mol. Depending on the starting material, the molecular weight can naturally be somewhat lower, but it is higher than for the corresponding non-cross-linked material (i.e. a material formed from the same monomers, used in the same proportions, but without subsequent cross-linking).

The precursor molecules of the siloxane polymers can be tetra-, tri-, di-, or mono-functional molecules. A tetra-functional molecule has four hydrolysable groups; a tri-functional molecule has three hydrolysable groups; a di-functional molecule has two; and mono-functional molecule has one.

According to one particularly preferred embodiment, the trifunctional or tetra-functional alkoxide (alkoxysilane) residues in the polymer are derived from, e.g. tri (lower alkoxy) silanes or tetra(lower alkoxy)silanes, such as ethoxysilane or tetramethoxysilane or mixtures thereof. By using a large portion of these compounds (at least 40 mol % of the total amount of precursors), the silicon dioxide content of the final deposited film can be maximized. Naturally, it is also possible to use precursors, i.e. silane monomers having organic functionalities, in the precursor procedure.

In the above process, various silane monomers, and in particular combinations of silane monomers, can be used as precursors of the present organosiloxane polymers.

According to one embodiment, the process according to the invention comprises hydrolyzing and polymerizing a monomer according to either or both of formulas I and II:

$$R^1{}_a SiX_{4-a} \quad \text{I}$$

and $$R^2{}_b SiX_{4-b} \quad \text{II}$$

wherein
$R^1$ and $R^2$ are independently selected from the group consisting of hydrogen, linear and branched alkyl and cycloalkyl, alkenyl, alkynyl, (alk)acrylate, epoxy, allyl, vinyl and alkoxy and aryl having 1 to 6 rings;
each X represents independently a hydrolysable group or a hydrocarbon residue; and
a and b is an integer 1 to 3.

Further, in combination with monomers of formula I or II or as such at least one monomer corresponding to Formula III can be employed:

$$R^3{}_c SiX_{4-c} \quad \text{III}$$

wherein
$R^3$ stands for hydrogen, alkyl or cycloalkyl which optionally carries one or several substituents, or alkoxy;
each X represents independently a hydrolysable group or a hydrocarbon residue having the same meaning as above; and c is an integer 1 to 3.

In any of the formulas above, the hydrolysable group is in particular an alkoxy group (cf. formula IV).

As discussed above, the present invention provides for the production of organosiloxane polymers using tri- or tetraalkoxysilane. The alkoxy groups of the silane can be identical or different and preferably selected from the group of radicals having the formula $$-O-R^4 \quad \text{IV}$$

wherein $R^4$ stands for a linear or branched alkyl group having 1 to 10, preferably 1 to 6 carbon atoms, and optionally exhibiting one or two substitutents selected from the group of halogen, hydroxyl, vinyl, epoxy and allyl.

The above precursor molecules are condensation polymerized to achieve the final siloxane polymer composition. Generally, in case of tri-, di- and mono-functional molecules, the other functional groups (depending on the number of hydrolysable group number) of the precursor molecules can be organic functionalities such as linear, aryl, cyclic, aliphatic groups. These organic groups can also contain reactive functional groups e.g. amine, epoxy, acryloxy, allyl or vinyl groups. These reactive organic groups can react during the thermal or radiation initiated curing step. Thermal and radiation sensitive initiators can be used to achieve specific curing properties from the material composition. When using the radiation sensitive initiators the material can perform as a negative tone photosensitive material in the lithography process.

According to a preferred embodiment, when using the above monomers, at least one of the monomers used for hydrolysation and condensation is selected from monomers having formulas I or II, wherein at least one substituent is an active group capable of achieving cross-linking to adjacent siloxane polymer chains upon a thermal or radiation initiated curing step. For preparing the prepolymer, the molar portion of units derived from such monomers (or the molar portion of monomers containing the active group calculated from the total amount of monomers) is about 0.1 to 70%, preferably about 0.5 to 50%, in particular about 1 to 40%. In some cases, the active group will be present in a concentration of about 1 to 15% based on the molar portion of monomers.

Particularly suitable monomers are selected from the group of triethoxysilane, tetraethoxysilane, methyltriethoxysilane, ethyltriethoxysilane, n-butyltriethoxysilane, methyldiethoxyvinylsilane, dimethyldiethoxysilane, phenyltrimethoxysilane, phenantrene-9-triethoxysilane, vinyltrimethoxysilane, 3-glysidoxypropyltrimethoxysilane, aminopropyltrimethoxysilane, methacryloxypropyltrimethoxisilane, acryloxypropyl-trimethoxysilane, allyltrimethoxysilane, epoxycyclohexylethyltrimethoxysilane and mixtures thereof.

According to one embodiment, at least 50 mole-% of the monomers being selected from the group of tetraethoxysilane, methyltriethoxysilane, ethyltriethoxysilane, n-butyl-triethoxysilane, methyldiethoxyvinylsilane and dimethyldiethoxysilane and mixtures thereof.

According to one embodiment, the siloxane composition comprises a siloxane prepolymer in a solvent phase, wherein
the partially cross-linked prepolymer has a siloxane backbone formed by repeating —Si—O— units and having a molecular weight in the range of from about 4,000 to about 10,000 g/mol, the siloxane backbone exhibiting hydroxyl groups in an amount of about 5 to 70% of the —Si—O— units and further exhibiting epoxy groups in an amount of 1 to 15 mol %, calculated from the amount of repeating units; and
the composition further comprises 0.1-3%, based on the weight of the solid matter, at least one cationic photo reactive compound.

The synthesis of the siloxane polymer is carried out in two steps. In the first synthesis step, in the following also called the hydrolysis step, the precursor molecules are hydrolyzed in presence typically of water and a catalyst, such as hydrochloric acid or another mineral or organic acid or a base, and in the second step, the polymerization step, the molecular weight of the material is increased by condensation polymerization. The water used in the hydrolysis step has typically a pH of less than 7, preferably less than 6, in particular less than 5.

During hydrolysation a partial condensation is started and a relatively low molecular weight prepolymer is formed. With some precursors and compositions it is possible that already at this synthesis stage the material may have a suitable molecular weight and properties to be used as the final material, and after addition of processing solvent, if needed, ready for film deposition and patterning.

In the second step, the obtained low molecular weight prepolymer is further condensation polymerized to yield a prepolymer having a molecular weight corresponding to the preselected range. It may be preferable in some cases to carry out the condensation in the presence of a suitable catalyst. In this step the molecular weight of the prepolymer is increased to facilitate suitable properties of the material and film deposition and processing.

To improve resolution of the material when applied to photolithography, the siloxane polymer is partially cross-linked during polymerization, in particular during or immediately after condensation polymerization. Various methods can be used for achieving cross-linking. For example, cross-linking method where two chains are joined via reactive groups not affecting any of the active groups intended for the UV photolithography can be employed. To mention an example, hydrosilylation for example using a proton on one chain reacting with a double bond on another chain will achieve cross-linking of desired kind.

Preferably, the cross-linking is be effected by adding an initiator. The initiator is used for creating a species that can initiate the polymerization of the "active" functional group. In case of an epoxy group, cationic or anionic initiators can be used. In case of a group with double bonds as "active" functional group in the synthesized material, radical initiators can be employed. Also thermal initiators (working according to the radical, cationic or anionic mechanism) can be used to facilitate the cross-linking of the "active" functional groups. Usually, the temperature of the cross-linking is in the range of about 30 to 200° C., typically cross-linking is carried out at refluxing conditions of the solvent.

Different active groups are preferably used for cross-linking and for photolithography. Thus, the cross-linking of the siloxane polymer can be achieved with an active group having double bonds, such as a vinyl or allyl or methacrylate group using radical initiators. And then epoxy groups can be employed for UV-lithography. And visa versa. The proportion of active groups required for cross-linking is generally smaller than for UV lithography, e.g. about 0.1 to 4 mol %, based on the monomers, for cross-linking and about 5 to 20 mol %, based on the monomers, for UV lithography.

The amount of the initiator added to the reaction mixture/solution is generally about to 10%, preferably about 0.5 to 5%, calculated from the mass of the siloxane polymer.

As a result of the cross-linking, the molecular weight will typically be 2- to 10-folded. Thus from a molecular weight in the range of about 500 to 1500 g/mol, the cross-linking will increase it to 2,000 or more, preferably to 4,000 or higher (4,000-12,000 g/mol).

It should be pointed out that it is also possible to increase the molecular weight of the siloxane prepolymer by having a catalyst present during condensation which increases the molecular weight. For example, in Example 2 there is a monomer with methacrylate groups which have been found to catalyse condensation polymerisation. An increase of the molecular weight comparable to that disclosed above can obtained in this way. For the purpose of the present invention, the term "partially cross-linked" covers also the catalysed increase of molecular weight during condensation.

The siloxane polymer synthesis, including the hydrolysis, the condensation and the cross-linking reactions, can be carried out using an inert solvent or inert solvent mixture, such as acetone or PGMEA, "non-inert solvent", such as alcohols, or without a solvent. The used solvent affects the final siloxane polymer composition. The reaction can be carried out in basic, neutral or acidic conditions in the presence of a catalyst. The hydrolysis of the precursors may be done in the presence of water (excess of water, stoichiometric amount of water or sub-stoichiometric amount of water). Heat may be applied during the reaction and refluxing can be used during the reaction.

Before further condensation the excess of water is removed from the material and at this stage it is possible to make a solvent exchange to another synthesis solvent if desired. This other synthesis solvent may function as the final or one of the final processing solvents of the siloxane polymer. The residual water and alcohols and other by-products may be removed after the further condensation step is finalized. Additional processing solvent(s) may be added during the formulation step to form the final processing solvent combination. Additives such as thermal initiators, radiation sensitive initiators, surfactants and other additives may be added prior to final filtration of the siloxane polymer. After the formulation of the composition, the polymer is ready for processing in, for example, a lithographic process.

By adjusting the hydrolysis and condensation conditions it is possible to control the concentration/content of the group capable of being deprotonated (e.g. an OH-group) and any residual leaving groups from the silane precursors (e.g. alkoxy groups) of the siloxane polymer composition and also to control the final molecular weight of the siloxane polymer. This greatly affects dissolution of the siloxane polymer material into the aqueous based developer solution.

Thus, for example, it has been found that when the final siloxane polymer has a high content of hydroxyl groups remaining and a low content of alkoxy (e.g. ethoxy) groups, the final siloxane polymer is easily dissolved into an alkaline-water developer solution (e.g. tetra methyl ammonium hydroxide; TMAH, or potassium hydroxide; KOH).

On the other hand if the remaining alkoxy-group content of the final siloxane polymer is high and it contains hardly any OH-groups, the final siloxane polymer has a very low solubility in an alkaline-water developer of the above kind. The OH-groups or other functional groups, such as amino ($NH_2$), thiol (SH), carboxyl or similar that result in solubility to the alkaline developer systems, can be attached directly to the silicon atoms of the siloxane polymer backbone or optionally attached to organic functionalities attached into the siloxane polymer backbone.

Hydroxy groups can be introduced into the siloxane polymer during the hydrolysis step. Amino, thiol and other groups can be incorporated by selecting a silane monomer which contains such groups. As an example of such a monomer, aminopropyltriethoxysilane can be mentioned.

Generally there will be at least about 1 deprotonating group/100 silicon atoms or —Si—O— units, preferably there is about 1 deprotonating group/50 —Si—O— units up to 10 deprotonating groups/10 —Si—O— units. Particularly preferred is from about 1 deprotonating group/20 —Si—O— units up to about 8 deprotonating groups/10 —Si—O— units. This way, the unexposed areas of the layer can easily be dissolved in the basic aqueous developer solution.

Suitable solvents for the synthesis are, for example, acetone, tetrahydrofuran (THF), toluene, 2-propanol, methanol, ethanol, propylene glycol monomethyl ether, propylene glycol propyl ether, methyl-tert-butylether (MTBE), propylene glycol monomethylether acetate (PGMEA), propylene glycol monomethylether PGME and propylene glycol propyl ether (PnP).

The organosiloxane polymer can be recovered in the reaction medium.

After synthesis, the material is diluted using a proper solvent or solvent combination to give a solids content which in film deposition will yield the preselected film thickness.

Usually, a further amount of an initiator molecule compound is added to the siloxane composition after synthesis. The initiator, which can be similar to the one added during polymerization, is used for creating a species that can initiate the polymerization of the "active" functional group in the UV curing step. Thus, in case of an epoxy group, cationic or anionic initiators can be used. In case of a group with double bonds as "active" functional group in the synthesized material, radical initiators can be employed. Also thermal initiators (working according to the radical, cationic or anionic mechanism) can be used to facilitate the cross-linking of the "active" functional groups. The choice of a proper combination of the photoinitiators also depends on the used exposure source (wavelength).

The concentration of the photo reactive compound in the composition is generally about 0.1 to 10%, preferably about 0.5 to 5%, calculated from the mass of the siloxane polymer. Depending on the degree of cross-linking of the siloxane polymer slightly less According to one embodiment, the organosiloxane polymer is formulated into a composition comprising at least about 20 mole-% of an organic hydroxyl compound.

Film thicknesses may range e.g. from 5 nm to 10 μm. Various methods of producing thin films are described in U.S. Pat. No. 7,094,709, the contents of which are herewith incorporated by reference.

A film produced according to the invention typically has a dielectric constant of 4 or below at a frequency of 100 kHz. The index of refraction lies between 1.2 to 1.9 at a wavelength of 633 nm.

Furthermore, the films exhibit a cross-linking degree of 70% or more at a UV dose of 100 mJ/cm$^2$ or less at I-line wavelength of mercury UV source.

The final coating film thickness has to be optimized according for each device and structure fabrication process. When, for example, PGMEA is employed as solvent for the synthesis, in one or both of the above-described the synthesis steps, it is not necessary to change the solvent for the final material, since PGMEA is regularly used also as a processing solvent in the semiconductor industry. This makes the synthesis procedure of the material easier and less time consuming.

We are able to conclude that when the OH-/alkoxy-group ratio in final siloxane polymer is in the range of 5:95 to 95:5, preferable between 10:90 to 90:10, the material will be well suited to be used together with alkaline-water based developers. It should be noted that the final siloxane polymer molecular weight also has an effect on the ability of the alkaline developer to dissolve the siloxane polymer during the lithography process.

The composition as described above may comprise solid nanoparticles in an amount of between 5 and 50 wt-% of the composition. The nanoparticles are in particular selected from the group of light scattering pigments and inorganic phosfors.

By means of the invention, materials are provided which are suitable for produce films and structures. The layers can be deposited on various substrate surfaces, such as glass, silicon, silicon nitride, metals and plastics.

The resolution in the lithography process is improved to the extent that it is better than 3 μm, preferably better than 1 μm (for thin films with a thickness of less than about 5 μm or even 4 μm). The aspect ratio is also improved: Siloxane polymer compositions according to the invention can be employed for making patterns exhibiting aspect ratios of smaller than 1:1 or even preferably smaller than 1:2.

The layers can be obtained by conventional and cost-efficient processing from the liquid phase. Such processing methods include spin-on, dip, spray, ink-jet, roll-to-roll, gravure, flexo-graphic, curtain, screen printing coating methods, extrusion coating and slit coating, but are not limited to these.

The patterning of the thermally and/or irradiation sensitive material compositions can be performed via direct lithographic patterning, conventional lithographic masking and etching procedure, imprinting and embossing, but are not limited to these.

The compositions can be used for making layers which are cured at relatively low processing temperatures, e.g. at temperatures of max 240° C. or even at temperature of 100° C. and in the range between these limits.

However, the layers formed from the compositions can also be cured at higher temperatures, i.e. temperatures over 240 and up to 450° C., or even up to 900° C. In such case, the films or structures produced from the compositions can be combined with a subsequent high temperature deposition step, such as sputtering, firing, thermal evaporation and/or a CVD process.

After film deposition (optionally patterning) and curing, the material film or structures are capable of withstanding aggressive wet etching and dry etching process steps of any subsequent deposition/patterning process steps.

The layers deposited from the compositions and cured as explained can perform as a planarization layer on a substrate or electronic device which may have protruding structures on top of it. This substrate may be part of a display device (e.g. liquid crystal display or plasma display or OLED display).

Generally, the material composition can function as optical layers in display devices (such as LCD, Plasma, OLED display), solar cell, LED or semiconductor devices.

It is also possible to use the compositions for making insulating layers on a substrate or in an electronic component. This insulating layer can also function simultaneously as a planarization layer on a substrate or in an electronic device. This substrate and/or electronic device (such as a thin film transistor) can be part of a display device (e.g. liquid crystal display or plasma display or OLED display).

In the following, the invention will be illustrated with the aid of a number of working examples giving further details of the preparation of the above-discussed siloxane polymer coating compositions.

Example 1

Phenyltrimethoxysilane (10.2 g, 5% mol), Methyltriethoxysilane (168.67 g, 85 mol %) and 3-glysidoxypropyltrimethoxysilane (24.32 g, 10 mol %) were weighed to a round bottom flask. 290.68 g of acetone was added to the round bottom flask. 112.3 g of water (0.1 M HNO$_3$) was added to the reaction flask within 5 min, while constantly stirring the reaction mixture using a magnetic stirrer. After this the reaction mixture was stirred at room temperature (in the following abbreviated "RT") for 17 min and refluxed for 5 hours using electric mantel. After the refluxing, most of the acetone was removed from the reaction mixture using a rotary evaporator (pressure 350->250 mbar, t(bath)=50° C.). After most of the acetone was removed, 260 g of PGMEA was added to the flask. The reaction mixture was evaporated further in the rotary evaporator (pressure 45 mbar, t(bath)=50° C., 1 hour) to perform a solvent exchange. After the solvent exchange the material solution was refluxed at 120° C. for 1 hour. After the 1 hour refluxing step the material is ready to use after formulation (addition of solvents and additives) and filtration. The material is formulated to certain solid content depending on the film thickness requirements and filtrated using 0.1 µm PTFE filter. The solution is ready to use for processing. The material had a resulting molecular weight ($M_w$) of 1820 g/mol.

Example 2

5% MAMPS Addition During Synthesis

Phenyltrimethoxysilane (10.2 g, 5% mol), Methyltriethoxysilane (146.83 g, 80 mol %), Methacryloxypropyltrimethoxysilane (12.78 g, 5 mol %) and 3-glysidoxypropyltrimethoxysilane (24.32 g, 10 mol %) were weighed to a round bottom flask. 291.2 g of acetone was added to the round bottom flask. 111.27 g of water (0.1 M $HNO_3$) was added to the reaction flask within 5 min, while constantly stirring the reaction mixture using a magnetic stirrer. After this the reaction mixture was stirred at RT for 23 min and refluxed for 5 hours using electric mantel. After the refluxing, most of the acetone was removed from the reaction mixture using a rotary evaporator (pressure 350->250 mbar, t(bath)=50° C.). After most of the acetone was removed, 260 g of PGMEA was added to the flask. The reaction mixture was evaporated further in the rotary evaporator (pressure 45 mbar, t(bath)=50° C.) to perform a solvent exchange. After the solvent exchange the material solution was refluxed at 120° C. for 2 hours. After the 2 hour refluxing step the material is ready to use after formulation (addition of solvents and additives) and filtration. The material is formulated to certain solid content depending on the film thickness requirements and filtrated using 0.1 µm PTFE filter. The solution is ready to use for processing. The material had a molecular weight ($M_w$) of 5600.

Example 3

2.5% MAMPS Addition During Synthesis

Phenyltrimethoxysilane (63.93 g, 5% mol), Methyltriethoxysilane (950.0 g, 82.5 mol %), Methacryloxypropyltrimethoxysilane (40.09 g, 2.5 mol %) and 3-glysidoxypropyltrimethoxysilane (152.57 g, 10 mol %) were weighed to a round bottom flask. 2413.18 g of acetone was added to the round bottom flask. 697.24 g of water (0.1 M $HNO_3$) was added to the reaction flask within 5 min, while constantly stirring the reaction mixture using a magnetic stirrer. After this the reaction mixture was stirred at RT for 23 min and refluxed for 5 hours using electric mantel. After the refluxing, most of the acetone was removed from the reaction mixture using a rotary evaporator (pressure 350->250 mbar, t(bath) =50° C.). After most of the acetone was removed, 904 g of PGMEA was added to the flask. The reaction mixture was evaporated further in the rotary evaporator (pressure 45 mbar, t(bath)=50° C.) to perform a solvent exchange. After the solvent exchange 5.81 g (1 m % out of the siloxane polymer solids) of AIBN (azo-bis-isobutyronitrile) thermal initiator was added to the material and the material solution was refluxed at 120° C. for 2 hours. After the 2 hour refluxing step the material is ready to use after formulation (addition of solvents and additives) and filtration. The material is formulated to certain solid content depending on the film thickness requirements and filtrated using 0.1 µm PTFE filter. The solution is ready to use for processing. The material had a molecular weight ($M_w$) of 6800.

Lithography Process for the Materials According to the Examples:

After the synthesis of the material, it is formulated to a solid contents which is adjusted depending on the required film thickness of the deposited film. The resulting film thickness is also dependent on the used deposition method (e.g. dip coating, spin coating, spray coating, slot coating) and has to be optimized case by case. Also the used processing solvent affects the resulting film thickness. By using spin-coating and propylene glycol monomethyl ether acetate (PGMEA) as processing solvent the material film thickness can be varied between 10 nm-10 µm, formulating the solid content between 1-65%, respectively. Even thicker structures can be achieved by using higher solid content. Low boiling point solvents should be selected as process solvents when low curing temperatures are required. Other additives such as surfactants (e.g. Byk-307 and FC 4430 or 4432) can be also used if needed.

In Example 1 the material has an epoxy functionality (obtained from the 3-glysidoxy-propyltrimethoxysilane precursor molecule) that can facilitate the polymerization during the UV curing step.

In addition to this "active" functional group (the epoxy group) in the synthesized material, an initiator molecule has to be used to create a species that can initiate the polymerization of the "active" functional group in the UV curing step. In case of an epoxy group, cationic or anionic initiators are used (such as Rhodorsil Photoinitiator 2074 and Cyracure Photoinitiator UVI-6976).

When using for example double bonds as the "active" functional group in the synthesized material, radical initiators (such as Ircacure 819, 814 and 651) are used to facilitate the polymerization during the UV curing step. Also thermal initiators (radical, cationic or anionic) can be used to facilitate the cross-linking of the "active" functional groups. The choice of a proper combination of the photoinitiators also depends on the used exposure source (wavelength).

The additive and photoinitiator concentrations are calculated from the solid content of the final siloxane polymer composition. The material works as a negative tone resist material, meaning that the material is polymerized in areas where exposed and becomes insoluble in the developer solution used. When the processing solvents and additives are added, the material is filtrated using 0.1 µm+0.04 µm PTFE filters. The solution is ready for use for processing. Below are represented three different processes to result in different film thicknesses.

For further details on lithographic applications of siloxane prepolymer composition reference is made to the copending U.S. patent application Ser. No. 11/948,724 filed Nov. 30, 2007 entitled "SILOXANE POLYMER COMPOSITIONS AND METHODS OF USING THE SAME", the contents of which is herewith incorporated by reference.

The attached drawings show photolithography resolution performance images for the materials of the examples described above.

Figure 2A:
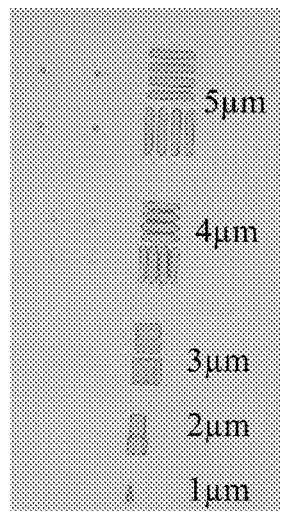
FIG. 2a shows an image taken using a microscope of the resolution performance for a typical low molecular weight material (1.5 μm coating thickness)
Figure 2B:
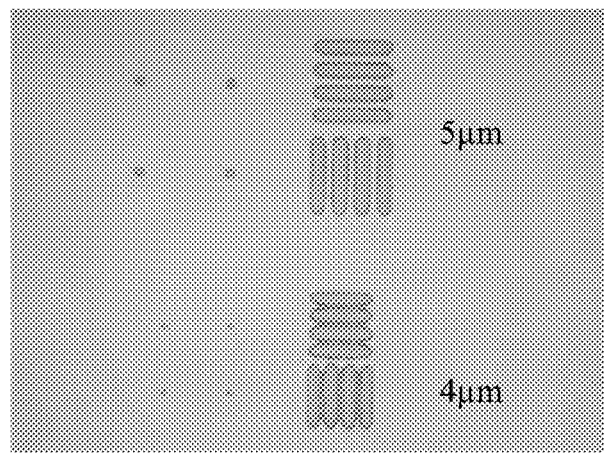
FIG. 2b shows an magnified image indicating that for the low molecular weight versions of the siloxane compositions the resolution cannot go below 4-5 μm (for 1.5 μm film)

FIGS. 2a and 2b represent material synthesized using a procedure described in Example 1. This procedure results in a relatively low molecular weight material. The low molecular weight of the material results in a poor resolution performance (4-5 µm resolution) of the coating material. It can be also clearly seen that the low molecular weight material results in a rounded patterned structure shapes: FIG. 2a shows the resolution performance for a typical low molecular weight material (1.5 µm coating thickness) with the image taken using a microscope. Similarly FIG. 2b illustrates the fact that for thin films, the low molecular weight versions of the siloxane compositions that the resolution cannot go under 4-5 µm (for 1.5 µm film). The shape of the resulting structure from the photolithography step is also rounded.

Figure 3A:
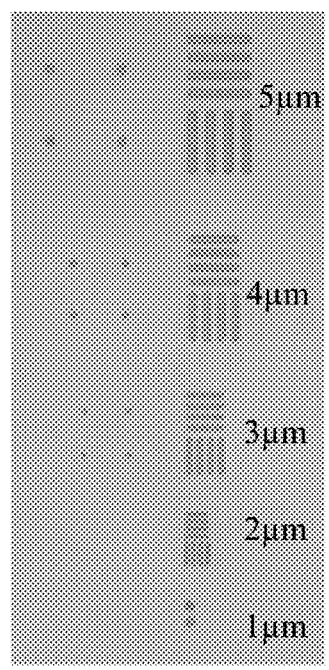
FIG. 3a shows the resolution marker image of a higher molecular weight material (1.5 μm coating thickness).
Figure 3A:
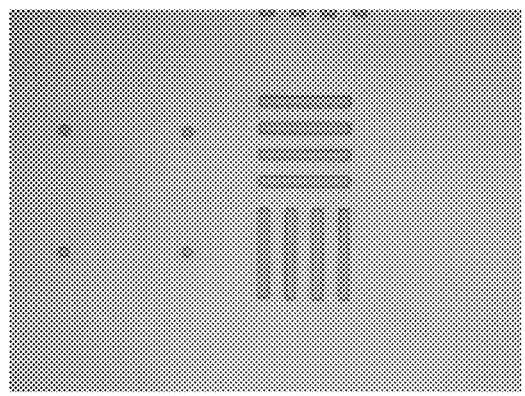

In case of the materials of Examples 2 and 3 materials, the molecular weight ($M_w$) of the material was increased to 5000-7000. It can be seen from the FIG. 3 that the higher molecular weight versions of the material result in a resolution in the range of 2-3 µm and the structure shape is very well defined and sharp; in FIG. 3a, the resolution marker image of a higher molecular weight material (1.5 µm coating thickness) indicates that a resolution of 2-3 µm could be achieved. Very little roundness is identified.

The difference between Example 1 and 2 synthesis runs are that in Example 2 there is a methacryloxypropyltrimethoxysilane added to the material. The methacryloxypropyl-trimethoxysilane it is capable of reacting (condensation polymerizing) the material further than in case of Example 1. This leads to higher molecular weight than in case of the Example 1 composition. In Example 3 the double bonds of the are polymerized during the synthesis run and molecular weight is increased. To initiate the polymerization a photoinitiator or thermal initiator is used.

Figure 4:
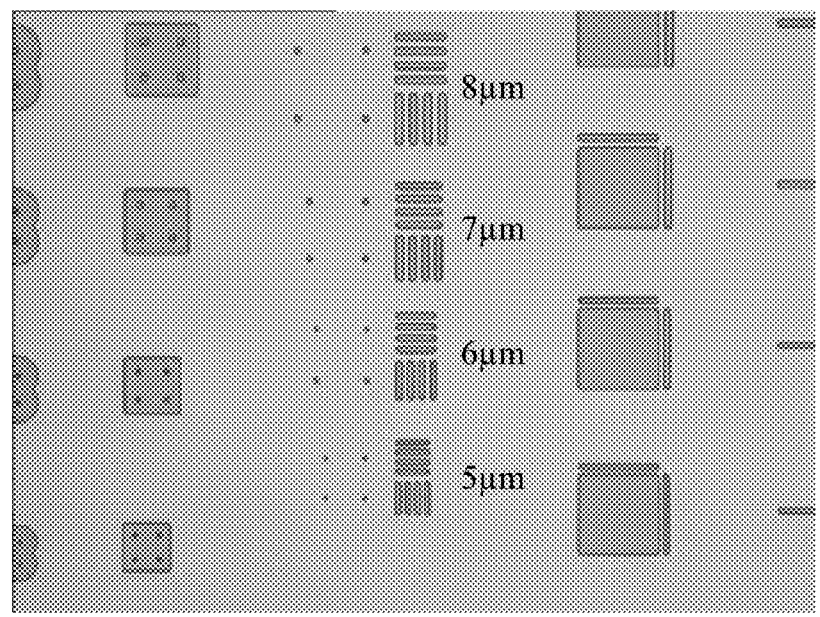
FIG. 4 shows the resolution marker image of a high molecular weight material at a film thickness of 4 μm film thickness.
Figure 5:
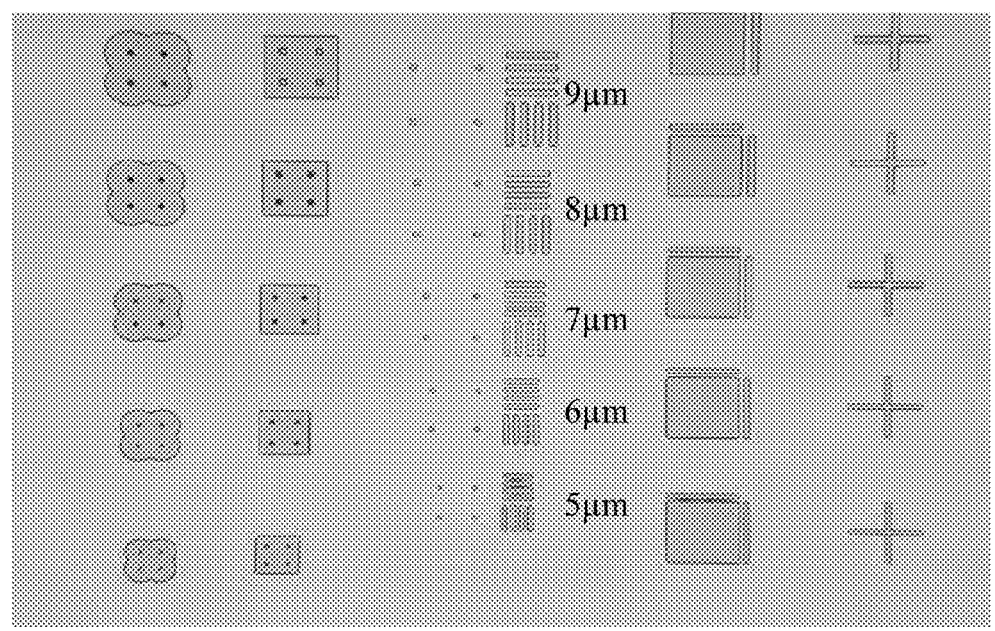
FIG. 5 shows the resolution marker image of a high molecular weight material as 12 μm film thickness.

FIG. 4 indicates that the structure shape of the higher molecular weight version of the material results in a sharp exposure profile of the exposed photomask and a 5 µm resolution. FIG. 5 shows that with a high molecular weight material at a film thickness of 12 µm, still a 6-7 µm resolution is achieved.

While the present invention has been illustrated and described with respect to a particular embodiment thereof, it should be appreciated by those of ordinary skill in the art that various modifications to this invention may be made without departing from the spirit and scope of the present.

What is claimed is:

1. A method of producing a siloxane prepolymer composition capable of forming a film that is completely soluble in an alkaline-aqueous solution and comprising a siloxane prepolymer with a siloxane backbone exhibiting a group which is capable of being deprotonated in an aqueous base solution and further exhibiting two different reactive functional groups, one of which is an active group having a double bond, said siloxane prepolymer having been cross-linked through the active groups by adding a radical initiator during polymerisation to increase the molecular weight thereof, wherein between 25 mol % and 75 mol % of the active groups are crosslinked, a solvent for the siloxane prepolymer, and a photo reactive compound, the method comprising:

hydrolysing at least two different silane monomers, one of which silane monomers has a methacrylate group and the other of which has an active functional group different from methacrylate, condensating the silane monomers to form a siloxane prepolymer having a molecular weight of about 2,000 to 20,000 g/mol, partially cross-linking the siloxane prepolymer through the methacrylate groups using a radical initiator, and incorporating a photo reactive compound and a solvent for the siloxane prepolymer, in order to formulate a siloxane prepolymer liquid composition.

2. A method of producing a siloxane prepolymer composition, comprising the steps of hydrolysing at least two different silane monomers, one of which silane monomers has an active group, condensating the silane monomers and cross-linking them through the active groups using a radical initiator to form a siloxane prepolymer having a molecular weight of about 2,000 to 20,000 g/mol, recovering the siloxane prepolymer in a solvent phase, and incorporating a photo reactive compound into the solvent phase, the silane monomers including monomers containing reactive functional group(s), which is (are) capable of achieving further cross-linking of siloxane prepolymers under the induction of the photo reactive compound, said hydrolysing and said condensation steps being carried out such that there are at least some hydroxyl groups present in the prepolymer.

3. The method according to claim 2, wherein the hydrolysis step is carried out in an aqueous solvent.

4. The method according to claim 2 wherein the active group is selected from a vinyl group and a methacrylate group.

5. The method according to claim 2 wherein the active group is a methacrylate group.

6. The method according to claim 2 wherein the active group is selected from amine, epoxy, acryloxy, allyl, and vinyl.

\* \* \* \* \*